(12) United States Patent
Nimbalker et al.

(10) Patent No.: US 7,873,893 B2
(45) Date of Patent: Jan. 18, 2011

(54) METHOD AND APPARATUS FOR ENCODING AND DECODING DATA

(75) Inventors: Ajit Nimbalker, Schaumburg, IL (US); Yufei W. Blankenship, Kildeer, IL (US); Brian K. Classon, Palatine, IL (US)

(73) Assignee: Motorola Mobility, Inc., Libertyville, IL (US)

( * ) Notice: Subject to any disclaimer, the term of this patent is extended or adjusted under 35 U.S.C. 154(b) by 826 days.

(21) Appl. No.: 11/680,116

(22) Filed: Feb. 28, 2007

(65) Prior Publication Data
US 2008/0205636 A1      Aug. 28, 2008

(51) Int. Cl.
H03M 13/00    (2006.01)
(52) U.S. Cl. .................................. 714/755; 711/157
(58) Field of Classification Search .......... 714/755; 711/157, 219
See application file for complete search history.

(56) References Cited

PUBLICATIONS

Takeshita, On Maximum Contention-Free interleavers and Permutation Polynomilas over Integer Rings. Apr. 28, 2005, IEEE Transaction on Information Theory. pp. 1-13.*
Release 6 interleaver(3GPP standard turbo code 25.212 V6.4.0), Mar. 2005, pp. 16-20.
Berrou C., Saouter Y., Douillard C., Kerouedan S., Jezequel M., ?Designing good permutations for Turbo Codes: towards a single model?, in Proceedings of ICC 2004, vol. 1, pp. 341-345, Jun. 2004.
Ericsson et al.: "QPP Interleaver Parameters", TDOC R1-071026 of 3GPP TSG RAN WG 1 Meeting #48, [Online] Feb. 12, 2007-Feb. 16, 2007, pp. 1-4, St. Louis, USA, Retrieved from the Internet: URL:http://www.3gpp/opg/ftp/tsg_ran/WG1_RL1/TSGR1_48/Docs/>[retrieved on Jun. 9, 2008].
Motorola: "Code Block Segmentation for LTE Channel Encoding", 3rd Generation Partnership Project (3GPP); Technical Specification Group (TSG) Radio Access Network (RAN); Workinggroup 1 (WG1), XX, XX, Feb. 12, 2007, pp. 1-5.
Ryu J et al.: "On quadratic inverses for quadratic permutation ploynominals over integer rings", IEEE Transactions On Information Therory, US, vol. 52, No. 3, Mar. 11, 2006, pp. 1254-1260.
Wien, Mathias et al.: "Performance Analysis of SVC", IEEE Transactions On Circuits and Systems for Video Technology, vol. 17, No. 9, Sep. 2007, all pages.

* cited by examiner

*Primary Examiner*—Sam Rizk (57) ABSTRACT

A method and apparatus for turbo encoding with a contention-free interleaver is provided herein. During operation an input block of size K' is received. The original input block and the interleaved input block are encoded to obtain a codeword block, wherein the original input block is interleaved using an interleaver of size K' and a permutation $\pi(i)=(f_1 \times i + f_2 \times i^2) \bmod K'$, where $0 \leq i \leq K'-1$ is the sequential index of the symbol positions after interleaving, $\pi(i)$ is the symbol index before interleaving corresponding to position i, K' is the interleaver size in symbols, and $f_1$ and $f_2$ are the factors defining the interleaver. The values of K', $f_1$, $f_2$ are taken from at least one row of a table. The codeword block is transmitted through the channel.

11 Claims, 4 Drawing Sheets

METHOD AND APPARATUS FOR ENCODING AND DECODING DATA

FIELD OF THE INVENTION

The present invention relates generally to encoding and decoding data and in particular, to a method and apparatus for turbo encoding and decoding.

BACKGROUND OF THE INVENTION

Digital data transmissions over wired and wireless links may be corrupted, for instance, by noise in the link or channel, by interference from other transmissions, or by other environmental factors. To combat the errors introduced by the channel, many communication systems employ error-correction techniques to aid in communication.

One technique utilized for error correction is turbo coding of an information block before it is transmitted over the channel. Utilizing such a technique, an encoder within the transmitter of a communication system will encode an input block u of length K' bits into a codeword block x of N bits. The codeword block is then transmitted over the channel, possibly after further processing such as channel interleaving as defined in the IEEE 802.16e specifications. At the receiver, the turbo decoder takes the received signal vector y of length N as input, and generates an estimate $\hat{u}$ of vector u.

Typically the turbo encoder is composed of two constituent convolutional encoders. The first constituent encoder takes the input block u as input in its original order, and the second constituent encoder takes the input block u in its interleaved order after passing u through a turbo interleaver $\pi$. The turbo encoder output x is composed of the systematic bits (equal to the input block u), the parity bits from the first constituent encoder, and the parity bits from the second constituent encoder.

Correspondingly the turbo decoder within the receiver of the communication system is composed of two constituent convolutional decoders, one for each constituent code. The constituent decoders are separated by the interleaver $\pi$ and the corresponding de-interleaver $\pi^{-1}$. Messages in the format of log-likelihood ratios (LLRs) are passed between the constituent decoders iteratively. The decision $\hat{u}$ is made after several iterations.

The turbo interleaver $\pi$ is the key component in the turbo code design. It is responsible for scrambling the input block u in a pseudo-random fashion, thus providing the codewords x with good weight distribution, hence good error-correcting capabilities. In addition to decoding performance, the definition of the turbo interleaver $\pi$ greatly impacts the implementation of the turbo decoder within the receiver. To allow high-level of parallel processing without memory access contentions, the turbo interleaver $\pi$ needs to have contention-free properties.

DETAILED DESCRIPTION OF THE DRAWINGS

In order to address the above-mentioned need for contention-free interleavers, a method and apparatus for turbo encoding with a contention-free interleaver is provided herein.

During operation an input block of size K' is received. The original input block and the interleaved input block are encoded to obtain a codeword block, wherein the original input block is interleaved using an interleaver of size K' and a permutation $\pi(i)=(f_1 \times i + f_2 \times i^2) \bmod K'$, where $0 \leq i \leq K'-1$ is the sequential index of the symbol positions after interleaving, $\pi(i)$ is the symbol index before interleaving corresponding to position i, K' is the interleaver size in symbols, and $f_1$ and $f_2$ are the factors defining the interleaver. The values of K', $f_1$, $f_2$ are taken from at least one row of Table 2. The codeword block is transmitted through the channel.

In yet another embodiment of the present invention, the original input block is interleaved using an interleaver of size K' and a permutation $\pi(i)=(f_1 \times i + f_2 \times i^2) \bmod K'$, where $0 \leq i \leq K'-1$ is the sequential index of the symbol positions after interleaving, $\pi(i)$ is the symbol index before interleaving corresponding to position i, K' is the interleaver size in symbols, and $f_1$ and $f_2$ are the factors defining the interleaver. The values of K', $f_1$, $f_2$ are taken from at least one row of Table 3.

Prior to describing encoding and decoding data, the following definitions are provided to set the necessary background:

K denotes the size of an information block.

K' denotes an interleaver size (i.e., input block size for which a turbo code interleaver is defined).

$K_{filler}$ denotes the number of filler bits added to the information block.

$\pi$ denotes the turbo code internal interleaver.

The flooring operation $\lfloor x \rfloor$ denotes the largest integer smaller than or equal to x and the ceiling operation $\lceil x \rceil$ denotes the smallest integer larger than or equal to x.

u denotes an input block, which has a length of K' and is sent to the turbo encoder at the transmitter. $\hat{u}$ denotes the estimated input block, which has a length of K' and is produced by the turbo decoder at the receiver. Note that $\hat{u}=u$ when there is no decoding error. Otherwise $\hat{u} \neq u$.

Figures 1, 5:
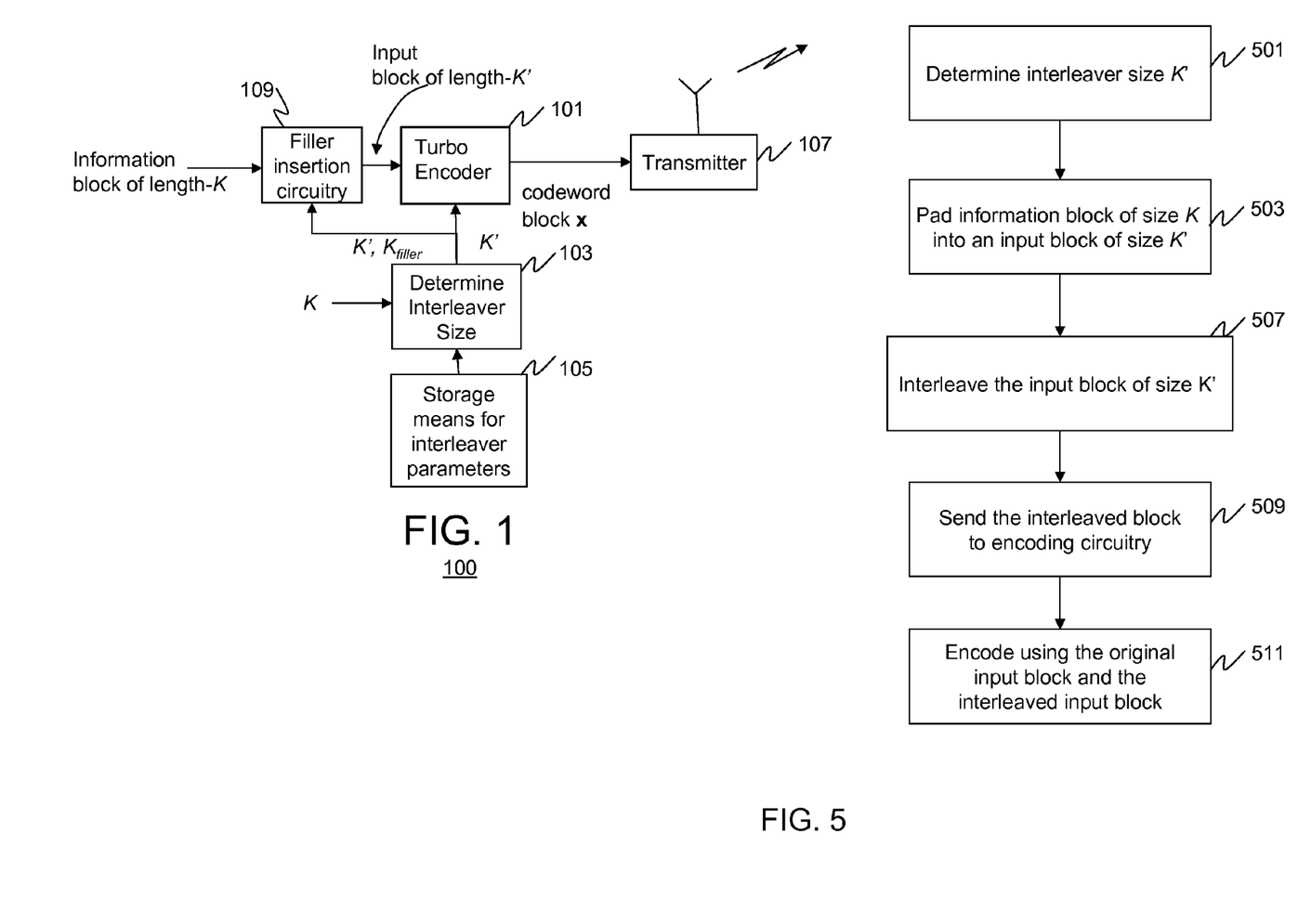
FIG. 1 is a block diagram of a transmitter.
FIG. 5 is a flow chart showing operation of the transmitter of FIG. 1.

Turning now to the drawings, wherein like numerals designate like components, FIG. 1 is a block diagram of transmitter 100. As shown, transmitter 100 comprises filler insertion circuitry 109, turbo encoder 101, interleaver size determination circuitry 103, interleaver parameter table 105, and transmitter 107. Encoder 101 is preferably a rate-⅓ 3GPP turbo coder, however, the techniques described herein for operating encoder 101 may be applied to other encoders, including, but not limited to turbo coders performing turbo coding with tail bits or no tail bits, tail-biting, binary or duo-binary turbo coders, turbo coders using different rate-matching and puncturing techniques, . . . , etc. Circuitry 103 determines the interleaver size K', where K' is from a set of sizes; wherein the set of sizes comprise $K'=a^p \times f$, $p_{min} \leq p \leq p_{max}$; $f_{min} \leq f \leq f_{max}$, wherein a is an integer, f is a continuous integer between $f_{min}$ and $f_{max}$, and p takes integer values between $p_{min}$ and $p_{max}$, a>1, $p_{max}>p_{min}$, $p_{min} \geq 1$.

During operation of transmitter 100, information block of size K needs to be encoded by the turbo encoder 101. For some communication systems where a large number of different Ks are used, it is not efficient (and often impossible) to define a contention-free (CF) interleaver for every information block size K. It is preferable if a small set (K') of well-designed CF interleavers is able to cover all the information block sizes. Given an information block size K, a suitable interleaver size K' may be chosen by circuitry 103 from the set of available sizes (e.g., interleaver sizes listed in table 105). The information block is then padded into an input block of size K' by circuitry 109 and sent as input to the turbo encoder 101. A typical arrangement is to pad the information block with $K_{filler}$ filler bits (via filler insertion circuitry 109). Note that the term "size" and "length" are used interchangeably to indicate the number of elements in a block or vector.

Once K' is chosen by circuitry 103, it is provided to turbo encoder 101. During encoding, a contention-free interleaver may be used (not shown in FIG. 1). For instance, the interleaver can use a permutation $\pi(i)=(iP_0+A+d(i))\bmod K'$. wherein $0 \leq i \leq K'-1$ is the sequential index of the symbol positions after interleaving, $\pi(i)$ is the symbol index before interleaving corresponding to position i, K' is the interleaver size in symbols, $P_0$ is a number that is relatively prime to K', A is a constant, C is a small number that divides K', and d(i) is a "dither" vector of the form $d(i)=\beta(i \bmod C)+P_0 \times \alpha(i \bmod C)$ where $\alpha(\cdot)$ and $\beta(\cdot)$ are vectors each of length C, periodically applied for $0 \leq i \leq K'-1$. As another example, the interleaver can use a permutation $\pi(i)=(f_1 \times i+f_2 \times i^2)\bmod K'$, where $0 \leq i \leq K'-1$ is the sequential index of the symbol positions after interleaving, $\pi(i)$ is the symbol index before interleaving corresponding to position i, K' is the interleaver size in symbols, and $f_1$ and $f_2$ are the factors defining the interleaver. In general a symbol may be composed of multiple bits and the step of interleaving may use an additional step of permuting the bits within a symbol. Without losing generality, the discussion below considers the typical case where a symbol is composed of one bit only (thus no need of permuting bits within a symbol), and the terms "bit" and "symbol" can be used interchangeably.

The output of turbo encoder 101 comprises a codeword block x, and x is sent to transmitter 107 where it is transmitted through the channel. The transmitter may perform additional processing such as rate matching, channel interleaving, modulation, etc., before transmitting the codeword block x through the channel.

Figure 2:
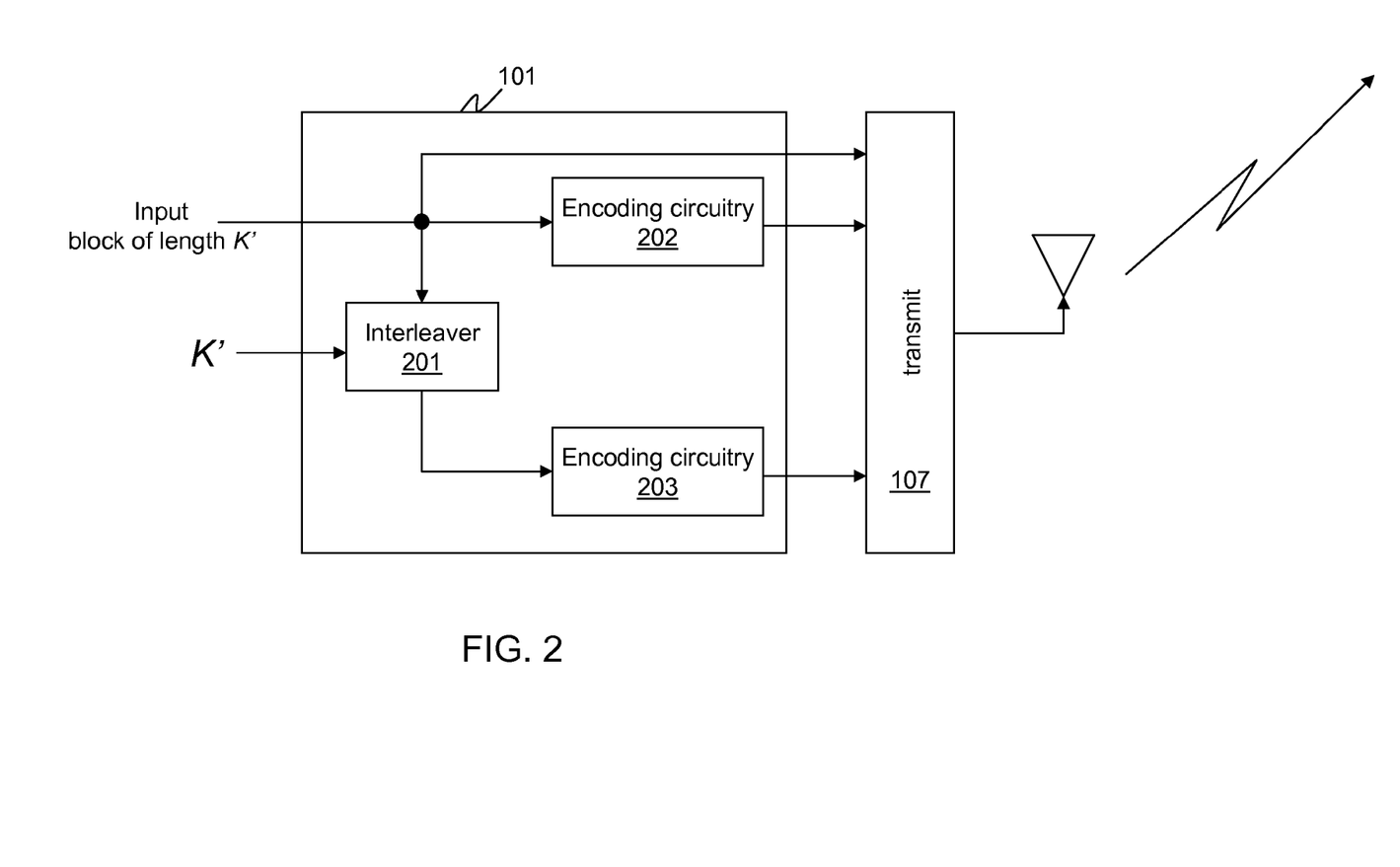
FIG. 2 is a block diagram of the turbo encoder of FIG. 1.

FIG. 2 is a block diagram of encoder 101 of FIG. 1. As shown, encoder 101 comprises interleaver 201, encoding circuitry 202, and encoding circuitry 203. An example of the encoder is the turbo coder defined in 3GPP specification. The mother code rate of the turbo coder defined in 3GPP has a native code rate of R=⅓. At the output of the turbo encoder, three bits are produced for each bit within the input block: one systematic bit (equal to the bit in the input block), one parity bit from constituent encoder 1, one parity bit from constituent encoder 2. In addition, the output of the turbo encoder may also include $N_{TB}$ tail bits, which are used to terminate the trellis of the constituent codes. For example, for 3GPP turbo code, $N_{TB}$=12 bits at the output of the turbo encoder, 6 tail bits per constituent code. On the other hand, it is possible to use tail-biting constituent convolutional codes, thus making $N_{TB}$=0.

Interleaver 201 can be a contention-free interleaver. An interleaver $\pi(i)$, $0 \leq i < K'$, is said to be contention-free for a window size W if and only if it satisfies the following constraint for both $\psi=\pi$ (interleaver) and $\psi=\pi^{-1}$ (de-interleaver), $$\left\lfloor \frac{\psi(j+tW)}{W} \right\rfloor \neq \left\lfloor \frac{\psi(j+vW)}{W} \right\rfloor \quad (1)$$

where $0 \leq j < W$, $0 \leq t$; $v < M(=K'/W)$, and $t \neq v$. Though it is not always necessary, for efficient turbo decoder design, typically all the M windows are full, where K'=MW. The terms in (1) are the memory bank addresses that are concurrently accessed by the M processors when writing the extrinsic values to the output memory banks during iterative decoding. If these memory bank addresses are all unique during each read and write operations, there are no contentions in memory access and hence the (de)interleaving latency can be avoided, leading to a high speed decoder implementation.

During operation of turbo encoder 101, input block of length K' bits enters both interleaver 201 and encoding circuitry 202. Interleaver 201 can be a contention-free interleaver of size K'.

Interleaver 201 interleaves the input block and passes the input block in interleaved order to encoding circuitry 203. Encoding circuitry 203 then encodes the interleaved input block. In a similar manner, encoding circuitry 202 encodes the original input block. The codeword block x is composed of systematic block (equal to the input block), output of encoding circuitry 202, and output of encoding circuitry 203. The codeword block x is then sent to transmitter 107.

As an example of the contention-free interleaver, an almost regular permutation (ARP) interleaver is given by the following expression $$\pi(i)=(iP_0+A+d)(i))\bmod K'$$

where $0 \leq i \leq K'-1$ is the sequential index of the bit positions after interleaving, $\pi(i)$ is the bit index before interleaving corresponding to position i, K' is the interleaver size, $P_0$ is a number that is relatively prime to K', A is a constant, C is a small number that divides K', and d(i) is a dither vector of the form $d(i)=\beta(i \bmod C)+P_0 \times \alpha(i \bmod C)$ where $\alpha(\cdot)$ and $\beta(\cdot)$ are vectors each of length C, periodically applied for $0 \leq i \leq K'-1$. Both $\alpha(\cdot)$ and $\beta(\cdot)$ are composed of multiples of C. The overall interleaver $\pi(\cdot)$ thus constructed has quasi-cyclic (i.e., periodic) properties with period C, and when used in tail-biting turbo codes, the turbo code itself becomes quasi-cyclic leading to a simplified code design procedure.

As another example of the contention-free interleaver, a Quadratic Polynomial Permutation (QPP) interleaver is given by the following expression $\pi(i)=(f_1 \times i+f_2 \times i^2)\bmod K'$, where $0 \leq i \leq K'-1$ is the sequential index of the symbol positions after interleaving, $\pi(i)$ is the symbol index before interleaving corresponding to position i, K' is the interleaver size in symbols, and $f_1$ and $f_2$ are the factors defining the interleaver. Similar to ARP interleavers, the turbo code is also quasi-cyclic if tail-biting.

If interleaver 201 can satisfy (1) for various values of M, then the decoder can be implemented using various degrees of parallelism (one for each M). Thus it is desirable to choose K' that has various factors. For an ARP interleaver of length K', any window size W, where W is a multiple of C and a factor of K', can be used for high-speed decoding without memory access contentions. With a different definition of parallel windows, it is possible to use any factor of K' as the number of parallel windows. For a QPP interleaver, every factor of the interleaver size K' is a possible level of parallelism M. This provides flexibility and scalability in decoder design by allowing a wide range of parallelism factors M. Thus, a good compromise between decoding speed and complexity can be made based on system (or classes of user elements) requirements.

Choosing Interleaver Size K':

As discussed above, interleaver size determination circuitry 103 needs to determine an interleaver size K' for a given K. This section describes a way of selecting a limited number of sizes (i.e., K') for which turbo code interleavers may be defined. As indicated previously, filler insertion circuitry (along with puncturing or rate-matching methods) may be used to handle any information block size K. In general, the interleaver size selection must take into consideration the decoding burden and performance degradation due to the filler bits.

The number of filler bits $K_{filler}$ padded to an information block to form an input block is desirable to be limited to a small percent (e.g., around 10-13%) of the information block size K. This is achieved by limiting the difference between adjacent interleaver sizes, i.e., adjacent K' values (assuming all available K' values are sorted in ascending order). The number of filler bits are minimized by choosing the smallest K' available such that K'≧K. The number of filler bits is $K_{filler}$=K'-K. However, other available values of K'≧K may also be chosen, if desired.

Consider the following set of sizes defined to cover information sizes between $K_{min}$ and $K_{max}$.

$$K'=a^p \times f, p_{min} \leq p \leq p_{max}; f_{min} \leq f \leq f_{max}, \quad (2)$$

where a is an integer, f is a continuous integer between $f_{min}$ and $f_{max}$, and p takes integer values between $p_{min}$ and $p_{max}$, a>1, $p_{max}$>$p_{min}$, $p_{min}$>1. Although not necessary, one can choose these parameters such that $K_{min}=a^{p_{min}} \times f_{min}$, and $K_{max}=a^{p_{max}} \times f_{max}$, while discarding any sizes that may not be needed. This method of selecting a limited set of sizes to cover a range of information block sizes is referred to as semi-log slicing. For a given information block of size K, a size K' is chosen based on the set of available interleaver sizes, and information block size K.

The semilog slicing is similar to the companding operation employed in compressing signals of large dynamic range, for example, A-law and mu-Law companders used in speech codecs. The semilog slicing rule allows an efficient design to cover a wide-range of information block sizes.

Of the several ways of choosing the parameters, one way of choosing $f_{min}$ and $f_{max}$ values is to let K' values resulting from adjacent p line up with each other, i.e., $a^p \times (f_{max}+1)=a^{p+1} \times f_{min}$, thus $$f_{max}=a \times f_{min}-1$$

For a given value of p, the separation between two adjacent block sizes K' is given by $a^p$, which means that a maximum of $a^p-1$ filler bits are added if the information block size K is in group p and the interleaver size is equal to K'. Thus, the fraction of filler bits $K_{filler}$ over the information block size K is bounded as shown below, which occurs when the block size K is slightly greater than the size given by (p, $f_{min}$), and using K' given by (p,$f_{min}$+1), $$\max\left(\frac{K_{filler}}{K}\right) = \frac{a^p - 1}{a^p \times f_{min} + 1}$$

$$\leq \frac{1}{f_{min}}$$

$$= \frac{a}{(f_{max} + 1)}.$$

Alternatively, K' values resulting from adjacent p can line up with each other via $a^p \times f_{max}=a^{p+1} \times (f_{min}-1)$, resulting in $f_{max}=a \times (f_{min}-1)$. This would give a similar $K_{filler}$/K bound. Therefore, the parameters for the semi-log slicing can be tuned according to the range of block sizes to be supported, and also on the tolerable fraction of filler bits. The choice of $f_{min}$ requires a balance between the following two requirements:

$f_{min}$ should be large to reduce the fraction of the filler bits;
$f_{min}$ should be small to limit the size of the interleaver table, since the number of block sizes defined for each p is $f_{max}-f_{min}+1=(a-1) \times f_{min}$, assuming $f_{max}=a \times f_{min}-1$.

The semi-log slicing method is very simple in that for any block size, the interleaver size K' to be used may be easily determined from (2).

Example of Interleaver Size Selection:

For 3GPP LTE, it is not essential to define CF interleaver for each block size between 40 and 6144 bits. A limited or a small set of well-designed CF interleavers is sufficient to cover all the block sizes. For undefined block sizes (i.e., for which CF interleavers are not defined), zero-padding (i.e., appending filler bits) can be used effectively, as described above.

As a first example, a set of interleavers suitable to cover information block sizes for 3GPP Long Term Evolution (LTE) in table 105 are defined based on the semi-log slicing method described above. Specifically, $$K'=2^p \times f, p=3,4,5,6; f=33,34,\ldots,64, \quad (3)$$

covering sizes from 264 to 4096. To cover the entire range of 40 bits to 6144 bits, K' set defined in (3) is extended from 264 to 40 with a step size of 8 (bits), and extended from 4096 to 6144 with a step size of 64 (bits). The entire set of 188 interleaver sizes are also listed in Table 1 below. Note that the sizes specified in (3) have a=2, $p_{min}$=3, $p_{max}$=6, $f_{min}$=33, $f_{max}$=64, $f_{max}$=a×($f_{min}$−1) and therefore $a^p \times f_{max}=a^{p+1} \times (f_{min}-1)$.

TABLE 1

The set of interleaver sizes K' defined for 3GPP LTE.

| 40 | 48 | 56 | 64 | 72 | 80 | 88 | 96 | 104 | 112 |
|---|---|---|---|---|---|---|---|---|---|
| 120 | 128 | 136 | 144 | 152 | 160 | 168 | 176 | 184 | 192 |
| 200 | 208 | 216 | 224 | 232 | 240 | 248 | 256 | 264 | 272 |
| 280 | 288 | 296 | 304 | 312 | 320 | 328 | 336 | 344 | 352 |
| 360 | 368 | 376 | 384 | 392 | 400 | 408 | 416 | 424 | 432 |
| 440 | 448 | 456 | 464 | 472 | 480 | 488 | 496 | 504 | 512 |
| 528 | 544 | 560 | 576 | 592 | 608 | 624 | 640 | 656 | 672 |
| 688 | 704 | 720 | 736 | 752 | 768 | 784 | 800 | 816 | 832 |
| 848 | 864 | 880 | 896 | 912 | 928 | 944 | 960 | 976 | 992 |
| 1008 | 1024 | 1056 | 1088 | 1120 | 1152 | 1184 | 1216 | 1248 | 1280 |
| 1312 | 1344 | 1376 | 1408 | 1440 | 1472 | 1504 | 1536 | 1568 | 1600 |
| 1632 | 1664 | 1696 | 1728 | 1760 | 1792 | 1824 | 1856 | 1888 | 1920 |
| 1952 | 1984 | 2016 | 2048 | 2112 | 2176 | 2240 | 2304 | 2368 | 2432 |
| 2496 | 2560 | 2624 | 2688 | 2752 | 2816 | 2880 | 2944 | 3008 | 3072 |
| 3136 | 3200 | 3264 | 3328 | 3392 | 3456 | 3520 | 3584 | 3648 | 3712 |
| 3776 | 3840 | 3904 | 3968 | 4032 | 4096 | 4160 | 4224 | 4288 | 4352 |
| 4416 | 4480 | 4544 | 4608 | 4672 | 4736 | 4800 | 4864 | 4928 | 4992 |
| 5056 | 5120 | 5184 | 5248 | 5312 | 5376 | 5440 | 5504 | 5568 | 5632 |
| 5696 | 5760 | 5824 | 5888 | 5952 | 6016 | 6080 | 6144 | | |

Once the interleaver sizes in 105 are determined, a CF interleaver may be designed for each interleaver size. Given any information block size K, the circuitry 103 can determine the interleaver size K' to be used for K by choosing the smallest value of K' from 105 that is greater than or equal to K. The parameters associated with the interleaver of size K' is then looked up from the storage means for interleaver parameter 105, which is normally stored in memory for the communication device.

Note that the sizes shown in Table 1 are only an example defined for K' with a minimum of 40 bits and a maximum of 6144 bits. Also, for simplicity, the sizes did not consider the difference between using tailed or tail-biting constituent codes. If the turbo encoder is made tail-biting, then the K's that are multiples of 7 cannot be used. These will be either removed or modified. Finally, additional interleaver sizes may be added to those above to decrease the spacing between interleavers. For example, extra interleavers may be defined in between the interleavers with spacing 16 in Table 1 so that interleavers are defined for every byte interval for the smaller K'.

Example of QPP Interleaver:

A subset of 71 CF QPP interleavers suitable to cover interleaver sizes in Table 1 for 3GPP Long Term Evolution (LTE) is shown in Table 2. These interleavers have a quadratic inverse polynomial such that the de-interleaver is also QPP. In addition, a subset of 10 CF QPP interleavers suitable to cover interleaver sizes in Table 1 for 3GPP Long Term Evolution (LTE) is shown in Table 3, where the interleavers have a de-interleaver (inverse of the interleaver) that is a permutation polynomial of degree 3 or 4.

For every interleaver size K' in Table 1, K' is a multiple of 4 (actually K' is a multiple of 8). For such sizes, the second-degree polynomial $\pi(i)=(f_1 \times i + f_2 \times i^2) \mod K'$ is a valid interleaver if and only if $f_2$ is divisible by every prime factor of K' and $f_1$ is not divisible by any prime factor of K'. It can be shown that all interleaver parameters in Table 2 and Table 3 satisfy this condition.

Although QPP interleavers are guaranteed to have de-interleavers that can be expressed in permutation polynomial format, i.e., $$\pi^{-1}(x) = \sum_{j=0}^{m} g_j x^j \mod K',$$

the degree m of the de-interleaver $\pi^{-1}(x)$ is only guaranteed to be no larger than the highest order of all the prime factors of $f_2$. Parameters ($f_1$, $f_2$) have to satisfy more stringent conditions if a low m is desired. Thus it can be difficult to design QPP interleavers that have a low-degree de-interleaver while providing good error-correcting performance.

With turbo coding, the complexity of both the interleaver and de-interleaver are important. Degree m of the de-interleaver can directly affect the complexity of the turbo decoder implementation. A low-degree de-interleaver is less complex to implement than a higher-degree de-interleaver. Therefore in search of QPP interleavers:

Preferably an interleaver with a quadratic de-interleaver (i.e., m=2, de-interleaver is also QPP) should be used. For example, each of the QPP interleavers in Table 2 has a quadratic de-interleaver without compromising turbo coding performance.

If for certain sizes K', error-correcting performance is significantly compromised if the interleaver has to have quadratic de-interleaver, an interleaver with de-interleaver of slightly higher degree, e.g., m=3 or 4, can be used instead. For example, each of the QPP interleavers in Table 3 has a de-interleaver with degree 3 or 4 and provide good turbo coding performance.

It should be pointed out that if no constraint is put on the de-interleaver, a QPP of length K' in Table 2 can have de-interleavers of degree as high as 9, and those in Table 3 can have de-interleaver of degree as high as 7.

Storage means for interleaver parameter 105 may store QPP interleaver parameters using the values of K', $f_1$, $f_2$ that are taken from at least one row of Table 2 or Table 3, if K' is included in Table 2 or Table 3. The interleaver 201 may use a QPP interleaver with the values of K', $f_1$, $f_2$ that are taken from at least one row of Table 2 or Table3, if K' is included in Table 2 or Table 3:

TABLE 2

Parameters for a subset of QPP interleavers defined for LTE with de-interleaver that is a permutation polynomial of degree 2 (i.e., quadratic inverse).

| K' | $f_1$ | $f_2$ |
|---|---|---|
| 112 | 41 | 84 |
| 144 | 17 | 108 |
| 160 | 21 | 120 |
| 184 | 57 | 46 |
| 208 | 27 | 52 |
| 232 | 85 | 58 |
| 264 | 17 | 198 |
| 304 | 37 | 76 |
| 336 | 115 | 84 |
| 344 | 193 | 86 |
| 360 | 133 | 90 |
| 376 | 45 | 94 |
| 392 | 243 | 98 |
| 400 | 151 | 40 |
| 408 | 155 | 102 |
| 424 | 51 | 106 |
| 440 | 91 | 110 |
| 448 | 29 | 168 |
| 464 | 247 | 58 |
| 480 | 89 | 180 |
| 488 | 91 | 122 |
| 496 | 157 | 62 |
| 656 | 185 | 82 |
| 672 | 43 | 252 |
| 736 | 139 | 92 |
| 768 | 217 | 48 |
| 816 | 127 | 102 |
| 848 | 239 | 106 |
| 880 | 137 | 110 |
| 896 | 215 | 112 |
| 944 | 147 | 118 |
| 976 | 59 | 122 |
| 992 | 65 | 124 |
| 1088 | 171 | 204 |
| 1120 | 67 | 140 |
| 1216 | 39 | 76 |
| 1280 | 199 | 240 |
| 1440 | 149 | 60 |
| 1664 | 183 | 104 |
| 1792 | 29 | 112 |
| 1856 | 57 | 116 |
| 1920 | 31 | 120 |
| 2016 | 113 | 420 |
| 2176 | 171 | 136 |
| 2368 | 367 | 444 |
| 2432 | 265 | 456 |
| 2496 | 181 | 468 |
| 2624 | 27 | 164 |
| 2688 | 127 | 504 |
| 2752 | 143 | 172 |
| 2880 | 29 | 300 |
| 3008 | 157 | 188 |
| 3200 | 111 | 240 |
| 3264 | 443 | 204 |
| 3392 | 51 | 212 |
| 3456 | 451 | 192 |
| 3520 | 257 | 220 |
| 3584 | 57 | 336 |
| 3648 | 313 | 228 |
| 3712 | 271 | 232 |
| 3840 | 331 | 120 |
| 3904 | 363 | 244 |
| 3968 | 375 | 248 |
| 4032 | 127 | 168 |
| 4224 | 43 | 264 |
| 4480 | 233 | 280 |
| 4608 | 337 | 480 |
| 4864 | 37 | 152 |
| 5376 | 251 | 336 |
| 5760 | 161 | 120 |
| 5888 | 323 | 184 |

TABLE 3

Parameters for a subset of QPP interleavers defined for LTE with de-interleaver that is a permutation polynomial of degree 3 or 4.

| K' | $f_1$ | $f_2$ |
|---|---|---|
| 1504 | 49 | 846 |
| 1696 | 55 | 954 |
| 1888 | 45 | 354 |
| 1952 | 59 | 610 |
| 4544 | 357 | 142 |
| 4736 | 71 | 444 |
| 4928 | 39 | 462 |
| 4992 | 127 | 234 |
| 5248 | 113 | 902 |
| 5824 | 89 | 182 |

Figure 3:
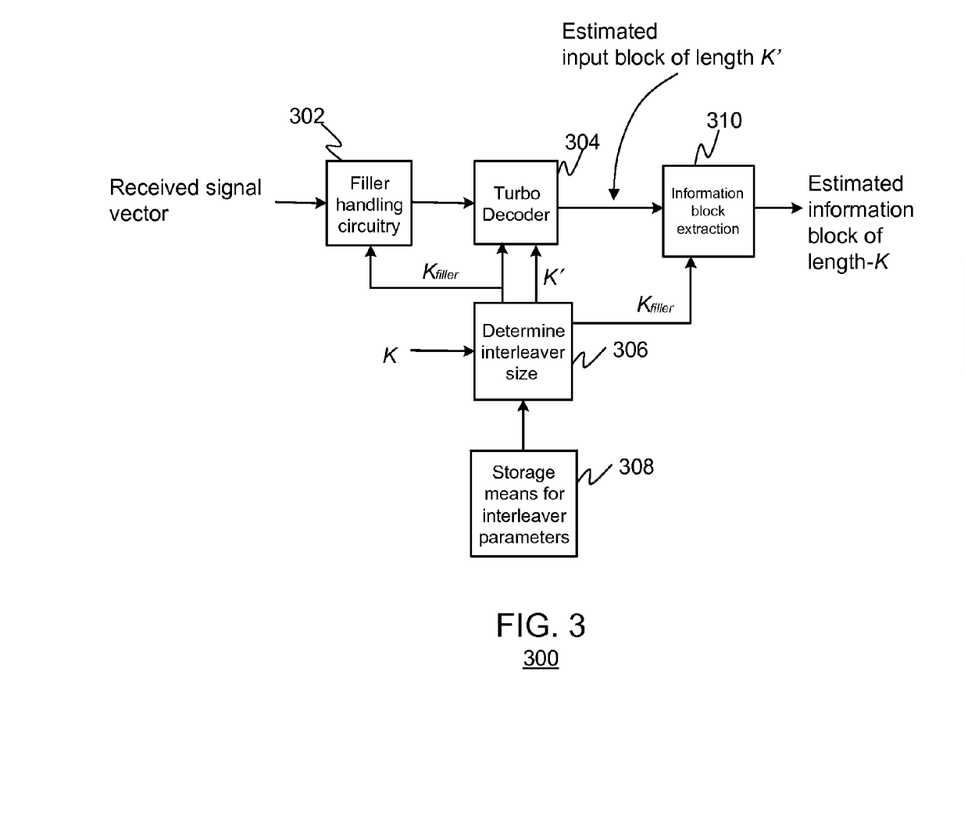
FIG. 3 is a block diagram of a receiver.

FIG. 3 is a block diagram of the receiver 300. At the input, the filler handling circuitry 302 receives a signal vector which may have been transmitted through the channel, e.g., over-the-air. Circuitry 306 then determines the interleaver size K' which can be done in a similar fashion as discussed above, for example by performing a table lookup from storage 308, or via calculations. Therefore, given the information block size K, the decoder 304 uses the same interleaver size K' that was used by the encoder 101. Filler handling circuitry 302 is used to appropriately process received signal vector and the filler bits positions (e.g., if filler bit positions are known, then the corresponding LLR magnitudes can be set to very high magnitudes during decoding). Then turbo decoder 304 performs decoding and obtains an estimate û of the input block of length K'. Finally the information block extraction circuitry 310 extracts an estimated information block from û. Though the filler handling circuitry 302 is shown outside the turbo decoder for ease of explanation, these two can be combined in implementation.

Figure 4:
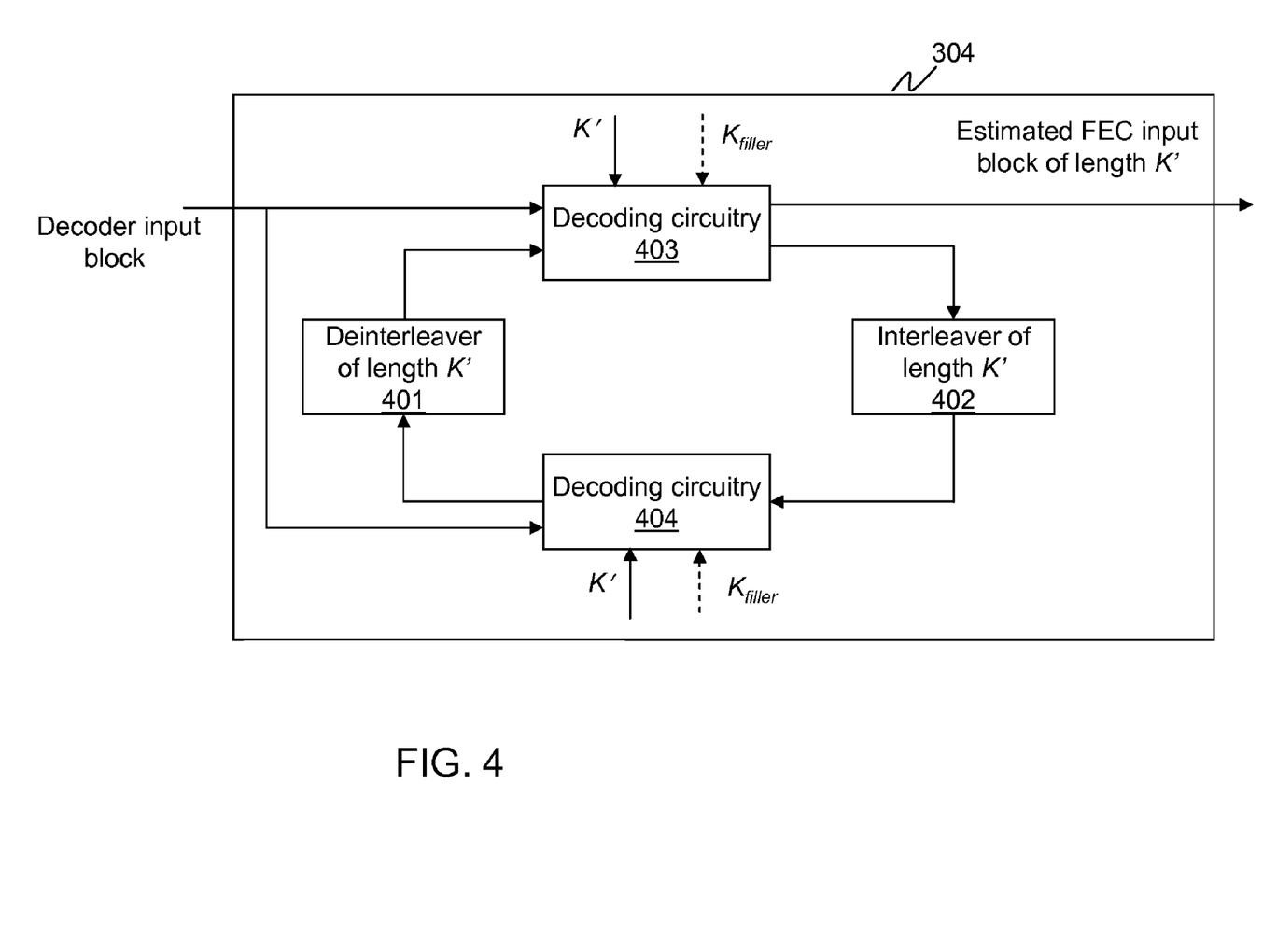
FIG. 4 is a block diagram of the turbo decoder of FIG. 4.

FIG. 4 is a block diagram of the turbo decoder 304 of FIG. 3. As is evident, interleaver 402 and de-interleaver 401 exist between decoding circuitry 403 and decoding circuitry 404. Iterative decoding takes place as known in the art, however, unlike prior-art decoders, interleaver size K' is from a set of sizes; wherein the set of sizes comprise $K'=a^p \times f$, $p_{min} \leq p \leq p_{max}$; $f_{min} \leq f \leq f_{max}$, wherein a is an integer, f is a continuous integer between $f_{min}$ and $f_{max}$, and p takes integer values between $p_{min}$ and $p_{max}$, $a>1$, $p_{max}>p_{min}$, $p_{min}>1$. Parameter $K_{filler}$ may or may not be needed by the turbo decoder 304, thus labeled as dashed line in FIG. 4.

Interleaver 402 may utilize permutation $\pi(i)=(f_1 \times i + f_2 \times i^2)$ mod K', where $0 \leq i \leq K'-1$ is the sequential index of the symbol positions after interleaving, $\pi(i)$ is the symbol index before interleaving corresponding to position i, K' is the interleaver size in symbols, and $f_1$ and $f_2$ are the factors defining the interleaver. The values of K', $f_1$, $f_2$ are taken from a row of Table 2 or Table 3, if K' is included in Table 2 or Table 3. The de-interleaver 401 performs an inverse function of interleaver 402.

FIG. 5 is a flow chart showing operation of the transmitter 100. The logic flow begins at step 501 where circuitry 103 determines interleaver size K' that is from a set of sizes; wherein the set of sizes comprise $K'=a^p \times f$, $p_{min} \leq p \leq p_{max}$; $f_{min} \leq f \leq f_{max}$, wherein a is an integer, f is a continuous integer between $f_{min}$ and $f_{max}$, and p takes integer values between $p_{min}$ and $p_{max}$, $a>1$, $p_{max}>p_{min}$, $p_{min}>1$.

At step 503 filler insertion circuitry 109 receives an information block of size K and pads the information block of size K into an input block u of size K' and outputs the input block u. Interleaver 201 then interleaves the input block of size K' (step 507) (preferably using a contention-free interleaver) and sends the interleaved block of size K' to encoding circuitry 203 (step 509). Finally, at step 511, the original input block and interleaved input block are encoded.

As discussed above, the step of interleaving the input block may comprise the step of using a permutation $\pi(i)=(f_1 \times i + f_2 \times i^2)$ mod K', where $0 \leq i \leq K'-1$ is the sequential index of the symbol positions after interleaving, $\pi(i)$ is the symbol index before interleaving corresponding to position i, K' is the interleaver size in symbols, and $f_1$ and $f_2$ are the factors defining the interleaver. The values of K', $f_1$, $f_2$ are taken from a row of Table 2 or Table 3, if K' is included in Table 2 or Table 3.

Figure 6:
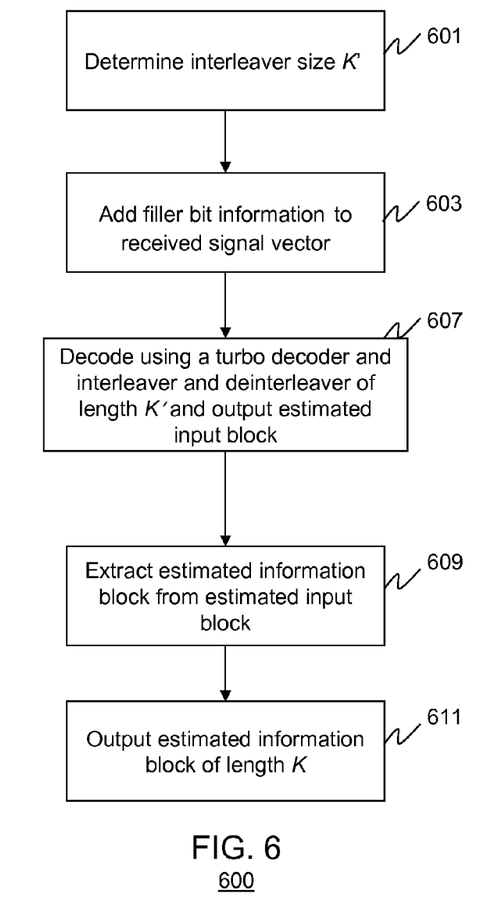
FIG. 6 is a flow chart showing operation of the receiver of FIG. 3.

FIG. 6 is a flow chart showing operation of the receiver of FIG. 3. The logic flow begins at step 601 where circuitry 306 determines the interleaver size K'. At Step 603, Circuitry 302 adds the filler bit information to the received signal vector, for example, if the filler bits and filler bit positions are known circuitry 302 may set to high magnitudes the Log Likelihood Ratios (LLRs) of those positions in the turbo decoder input. At step 607 turbo decoder decodes the decoder input block using interleaver and de-interleaver of size K' and outputs an estimated û of the input block of length K'. At step 609 information block extraction circuitry 310 removes filler bits to obtain an estimate of the information block of length K. Finally at Step 611, the estimated information block is output.

While the invention has been particularly shown and described with reference to a particular embodiment, it will be understood by those skilled in the art that various changes in form and details may be made therein without departing from the spirit and scope of the invention. In one example, the interleaver table may be enhanced further to handle special cases, including: (a) Using an additional set of interleaver sizes defined to cover any special block sizes that must be handled, e.g., without filler bits or with fewer filler bits. (b) The interleaver sizes can be slightly adjusted by adding or subtracting a small value from the semilog slice sizes. In another example, although the invention has been described above assuming binary-input turbo encoder, the same principle can be applied when the turbo encoder takes symbols as input. For example, a duo-binary turbo code takes a symbol of two binary bits at a time, and the turbo interleaver permutes symbols (further scrambling such as alternating the bits within a symbol may be performed). In such a case, the input block size is measured in symbols, and the interleaver size is equal to the number of symbols in the input block. In another example, although the above description assumes that the interleaver sizes and the interleaver parameters are stored in a look-up table, it is possible that they may be determined via other means such as algebraic calculation. In yet another example, although the above description assumes a turbo code, the method is also applicable to other FEC schemes including, for example, low-density parity-check (LDPC) codes, Reed-Solomon (RS) Codes, etc. It is intended that such changes come within the scope of the following claims.

The invention claimed is:

1. A method for operating a turbo encoder, the method comprising the steps of:

receiving an input block of size K'; and encoding the input block and an interleaved input block to obtain a codeword block, wherein the input block is interleaved using an interleaver of size K' and a permutation $\pi(i)=(f_1 \times i + f_2 \times i^2)$mod K', where $0 \leq i \leq K'-1$ is a sequential index of symbol positions after interleaving, π(i) is a symbol index before interleaving corresponding to position i, K' is an interleaver size in symbols, and $f_1$ and $f_2$ are factors defining the interleaver, and wherein the values of K', $f_1$, $f_2$ are taken from at least one row of the following table:

| K' | $f_1$ | $f_2$ |
|---|---|---|
| 112 | 41 | 84 |
| 144 | 17 | 108 |
| 160 | 21 | 120 |
| 184 | 57 | 46 |
| 208 | 27 | 52 |
| 232 | 85 | 58 |
| 264 | 17 | 198 |
| 304 | 37 | 76 |
| 336 | 115 | 84 |
| 344 | 193 | 86 |
| 360 | 133 | 90 |
| 376 | 45 | 94 |
| 392 | 243 | 98 |
| 400 | 151 | 40 |
| 408 | 155 | 102 |
| 424 | 51 | 106 |
| 440 | 91 | 110 |
| 448 | 29 | 168 |
| 464 | 247 | 58 |
| 480 | 89 | 180 |
| 488 | 91 | 122 |
| 496 | 157 | 62 |
| 656 | 185 | 82 |
| 672 | 43 | 252 |
| 736 | 139 | 92 |
| 768 | 217 | 48 |
| 816 | 127 | 102 |
| 848 | 239 | 106 |
| 880 | 137 | 110 |
| 896 | 215 | 112 |
| 944 | 147 | 118 |
| 976 | 59 | 122 |
| 992 | 65 | 124 |
| 1088 | 171 | 204 |
| 1120 | 67 | 140 |
| 1216 | 39 | 76 |
| 1280 | 199 | 240 |
| 1440 | 149 | 60 |
| 1664 | 183 | 104 |
| 1792 | 29 | 112 |
| 1856 | 57 | 116 |
| 1920 | 31 | 120 |
| 2016 | 113 | 420 |
| 2176 | 171 | 136 |
| 2368 | 367 | 444 |
| 2432 | 265 | 456 |
| 2496 | 181 | 468 |
| 2624 | 27 | 164 |
| 2688 | 127 | 504 |
| 2752 | 143 | 172 |
| 2880 | 29 | 300 |
| 3008 | 157 | 188 |
| 3200 | 111 | 240 |
| 3264 | 443 | 204 |
| 3392 | 51 | 212 |
| 3456 | 451 | 192 |
| 3520 | 257 | 220 |
| 3584 | 57 | 336 |
| 3648 | 313 | 228 |
| 3712 | 271 | 232 |
| 3840 | 331 | 120 |
| 3904 | 363 | 244 |
| 3968 | 375 | 248 |
| 4032 | 127 | 168 |
| 4224 | 43 | 264 |
| 4480 | 233 | 280 |
| 4608 | 337 | 480 |
| 4864 | 37 | 152 |
| 5376 | 251 | 336 |
| 5760 | 161 | 120 |
| 5888 | 323 | 184. |

2. The method of claim 1 further comprising the step of: transmitting the codeword block through a channel.

3. A method for operating a turbo encoder, the method comprising the steps of:

receiving an input block of size K'; and encoding the input block and an interleaved input block to obtain a codeword block, wherein the input block is interleaved using an interleaver of size K' and a permutation $\pi(i)=(f_1 \times i + f_2 \times i^2) \bmod K'$, where $0 \leq i \leq K'-1$ is a sequential index of symbol positions after interleaving, π(i) is a symbol index before interleaving corresponding to position i, K' is an interleaver size in symbols, and $f_1$ and $f_2$ are factors defining the interleaver, and wherein values of K', $f_1$, $f_2$ are taken from at least one row of the following table:

| K' | $f_1$ | $f_2$ |
|---|---|---|
| 1504 | 49 | 846 |
| 1696 | 55 | 954 |
| 1888 | 45 | 354 |
| 1952 | 59 | 610 |
| 4544 | 357 | 142 |
| 4736 | 71 | 444 |
| 4928 | 39 | 462 |
| 4992 | 127 | 234 |
| 5248 | 113 | 902 |
| 5824 | 89 | 182. |

4. An apparatus for operating a turbo encoder, the apparatus comprising:

interleaver size determination circuitry that determines an interleaver size K' from a set of sizes;

filler insertion circuitry receiving an input block of size K and padding the input block of size K into an input block of size K';

an interleaver interleaving the input block of size K', wherein the interleaver uses a permutation $\pi(i)=(f_1 \times i + f_2 \times i^2) \bmod K'$, where $0 \leq i \leq K'-1$ is a sequential index of symbol positions after interleaving, π(i) is a symbol index before interleaving corresponding to position i, K' is an interleaver size in symbols, and $f_1$ and $f_2$ are factors defining the interleaver, and wherein values of K', $f_1$, $f_2$ are taken from at least one row of the following table:

| K' | $f_1$ | $f_2$ |
|---|---|---|
| 112 | 41 | 84 |
| 144 | 17 | 108 |
| 160 | 21 | 120 |
| 184 | 57 | 46 |
| 208 | 27 | 52 |
| 232 | 85 | 58 |
| 264 | 17 | 198 |
| 304 | 37 | 76 |
| 336 | 115 | 84 |
| 344 | 193 | 86 |
| 360 | 133 | 90 |
| 376 | 45 | 94 |
| 392 | 243 | 98 |
| 400 | 151 | 40 |

-continued

| K' | $f_1$ | $f_2$ |
|---|---|---|
| 408 | 155 | 102 |
| 424 | 51 | 106 |
| 440 | 91 | 110 |
| 448 | 29 | 168 |
| 464 | 247 | 58 |
| 480 | 89 | 180 |
| 488 | 91 | 122 |
| 496 | 157 | 62 |
| 656 | 185 | 82 |
| 672 | 43 | 252 |
| 736 | 139 | 92 |
| 768 | 217 | 48 |
| 816 | 127 | 102 |
| 848 | 239 | 106 |
| 880 | 137 | 110 |
| 896 | 215 | 112 |
| 944 | 147 | 118 |
| 976 | 59 | 122 |
| 992 | 65 | 124 |
| 1088 | 171 | 204 |
| 1120 | 67 | 140 |
| 1216 | 39 | 76 |
| 1280 | 199 | 240 |
| 1440 | 149 | 60 |
| 1664 | 183 | 104 |
| 1792 | 29 | 112 |
| 1856 | 57 | 116 |
| 1920 | 31 | 120 |
| 2016 | 113 | 420 |
| 2176 | 171 | 136 |
| 2368 | 367 | 444 |
| 2432 | 265 | 456 |
| 2496 | 181 | 468 |
| 2624 | 27 | 164 |
| 2688 | 127 | 504 |
| 2752 | 143 | 172 |
| 2880 | 29 | 300 |
| 3008 | 157 | 188 |
| 3200 | 111 | 240 |
| 3264 | 443 | 204 |
| 3392 | 51 | 212 |
| 3456 | 451 | 192 |
| 3520 | 257 | 220 |
| 3584 | 57 | 336 |
| 3648 | 313 | 228 |
| 3712 | 271 | 232 |
| 3840 | 331 | 120 |
| 3904 | 363 | 244 |
| 3968 | 375 | 248 |
| 4032 | 127 | 168 |
| 4224 | 43 | 264 |
| 4480 | 233 | 280 |
| 4608 | 337 | 480 |
| 4864 | 37 | 152 |
| 5376 | 251 | 336 |
| 5760 | 161 | 120 |
| 5888 | 323 | 184. |

5. The apparatus of claim 4 further comprising:
an encoder that encodes the input block and the interleaved input block to obtain a codeword block.

6. The apparatus of claim 4 where interleaver size K' is determined from a set of sizes comprises using $K'=\alpha^p \times f$, $p_{min} \leq p \leq p_{max}$; $f_{min} \leq f \leq f_{max}$, wherein $\alpha$ is an integer, f is a continuous integer between $f_{min}$ and $f_{max}$, and p takes integer values between $p_{min}$ and $p_{max}$, $a>1$, $p_{max}>p_{min}$, $p_{min}>1$.

7. The apparatus of claim 6 wherein $\alpha=2$, $p_{min}=3$, $p_{max}=6$, $f_{min}=33$, $f_{max}=64$.

8. The apparatus of claim 6 where an inverse of the interleaver is quadratic.

9. An apparatus for operating a turbo encoder, the apparatus comprising:
interleaver size determination circuitry that determines an interleaver size K' from a set of sizes;
filler insertion circuitry receiving an input block of size K and padding the input block of size K into an input block of size K';
an interleaver interleaving the input block of size K', wherein interleaver uses a permutation $\pi(i)=(f_1 \times i + f_2 \times i^2)$ mod K', where $0 \leq i \leq K'-1$ is a sequential index of symbol positions after interleaving, $\pi(i)$ comprises a symbol index before interleaving corresponding to position i, K' is an interleaver size in symbols, and $f_1$ and $f_2$ are factors defining the interleaver, and wherein values of K', $f_1$, $f_2$ are taken from at least one row of the following table:

| K' | $f_1$ | $f_2$ |
|---|---|---|
| 1504 | 49 | 846 |
| 1696 | 55 | 954 |
| 1888 | 45 | 354 |
| 1952 | 59 | 610 |
| 4544 | 357 | 142 |
| 4736 | 71 | 444 |
| 4928 | 39 | 462 |
| 4992 | 127 | 234 |
| 5248 | 113 | 902 |
| 5824 | 89 | 182. |

10. The apparatus of claim 9 further comprising:
an encoder that encodes the input block and the interleaved input block to obtain a codeword block.

11. The apparatus of claim 9 wherein an inverse of the interleaver is degree 3 or 4.

* * * * *